(12) United States Patent
Dunn et al.

(10) Patent No.: US 6,853,785 B2
(45) Date of Patent: Feb. 8, 2005

(54) INDEX MODULATION IN GLASS USING A FEMTOSECOND LASER

(75) Inventors: Douglas Scott Dunn, Maplewood, MN (US); Jeffrey Michael Florczak, Austin, TX (US); Jeffrey Bruce Hill, Stillwater, MN (US); Harvey William Kalweit, Burnsville, MN (US)

(73) Assignee: 3M Innovative Properties Co., St. Paul, MN (US)

( * ) Notice: Subject to any disclaimer, the term of this patent is extended or adjusted under 35 U.S.C. 154(b) by 138 days.

(21) Appl. No.: 10/295,804

(22) Filed: Nov. 15, 2002

(65) Prior Publication Data

US 2003/0110810 A1 Jun. 19, 2003

Related U.S. Application Data

(60) Provisional application No. 60/341,565, filed on Dec. 14, 2001.

(51) Int. Cl.[7] .................................................. G02B 6/02
(52) U.S. Cl. ........................................ 385/123; 385/37
(58) Field of Search ............................. 385/10, 33, 37, 385/123–125, 141, 142; 65/388, 389, 392

(56) References Cited

U.S. PATENT DOCUMENTS

| | | | |
|---|---|---|---|
| 4,090,776 A | | 5/1978 | Bernal G. et al. .......... 385/132 |
| 5,620,495 A | * | 4/1997 | Aspell et al. ................. 65/392 |
| 5,679,264 A | | 10/1997 | Gsell .......................... 210/767 |
| 5,761,111 A | | 6/1998 | Glezer ......................... 365/106 |
| 5,978,538 A | * | 11/1999 | Miura et al. ................. 385/123 |
| 6,127,050 A | | 10/2000 | Fromson et al. ............ 428/645 |

FOREIGN PATENT DOCUMENTS

| | | |
|---|---|---|
| EP | 1 045 262 | 10/2000 |
| EP | 1 116 965 | 7/2001 |
| WO | WO 01/09899 A1 | 2/2001 |
| WO | WO 01/44871 A1 | 6/2001 |
| WO | WO 01/82336 A2 | 11/2001 |

OTHER PUBLICATIONS

Article: Miura et al., "Photowritten Optical Waveguides in Various Glasses with Ultrashort Pulse Laser," *Appl. Phys. Lett.*, vol. 71, No. 23, Dec. 8, 1997, pp. 3329–3331.
Article: Homoelle et al., "Infrared Photosensitivity in Silica Glasses Exposed to Femtosecond Laser Pulses," *Optics Letters*, vol. 24, No. 18, Sep. 15, 1999, pp. 1311–1313.
Article: Streltsov et al., "Fabrication and Analysis of a Directional Coupler Written in Glass by Nanojoule Femtosecond Laser Pulses," *Optics Letters*, vol. 26, No. 1, Jan. 1, 2001, pp. 42–43.
Article: Hirao et al., "Writing Waveguides and Gratings in Silica and Related Materials by a Femtosecond Laser," *Journal of Non–Crystalline Solids*, vol. 239, (1998), pp. 91–95.
Article: Kondo et al., "Fabrication of Long–Period Fiber Gratings by Focused Irradiation of Infrared Femtosecond Laser Pulses," *Optics Letters*, vol. 24, No. 10, May 15, 1999, pp. 646–648.

* cited by examiner

*Primary Examiner*—Phan T. H. Palmer
(74) *Attorney, Agent, or Firm*—Sean Golman

(57) ABSTRACT

The invention relates to inducing a refractive index change in the glass substrate of a polymer coated optical device by using a high numeric aperture lens to focus a femtosecond laser beam through the polymeric coating to the substrate without damaging the polymeric coating.

18 Claims, 5 Drawing Sheets

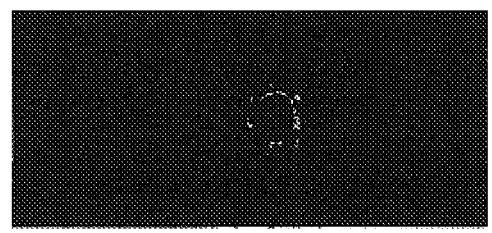
*Fig. 7*
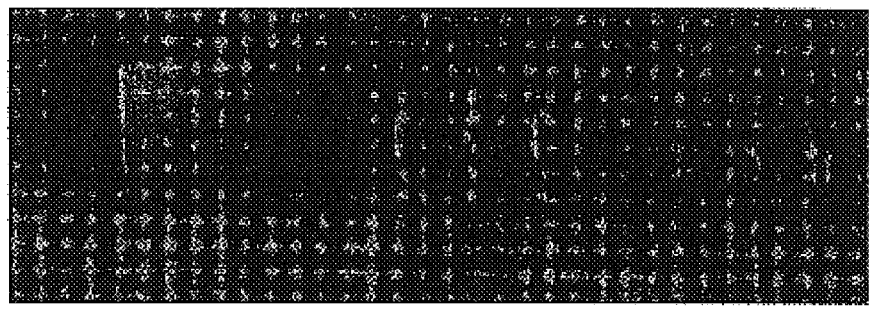
*Fig. 8a*  *Fig. 8b*  *Fig. 8c*

INDEX MODULATION IN GLASS USING A FEMTOSECOND LASER

CROSS REFERENCE TO RELATED APPLICATION

This application claims priority to U.S. Provisional Patent Application No. 60/341,565, filed Dec. 14, 2001.

TECHNICAL FIELD

This invention relates to a process for producing a region of modified refractive index in the interior of a glass sample covered with a polymeric protective coating, and the resulting article.

BACKGROUND

The use of femtosecond lasers to produce permanent changes in the refractive index of various glasses has been described in the scientific literature. Index modified glass materials can be formed into, e.g., waveguides, couplers, and diffraction gratings. U.S. Pat. No. 5,761,111 (Glezer) describes a femtosecond laser process for producing two- and three-dimensional optical storage in glasses by producing regions containing volume elements (voxels) that range from submicron to a few microns in diameter with lengths in the range of a few microns to millimeters. U.S. Pat. No. 5,978,538 (Miura) describes a femtosecond laser process for forming optical waveguides in oxide, halide, and chalcogenide glasses. WO 01/09899 describes a femtosecond laser process for direct writing of optical devices in soft, silica-based glasses.

In Kondo, et al., *Optics Letters*, Vol. 24, p. 646, the authors describe fabricating long-period fiber gratings by using focused irradiation of infrared femtosecond laser pulses. The authors initially attempted to write through the polymeric coating, but found that even when the laser power was reduced to such a degree that no index changes in the core occurred, the acrylate resin was ablated.

SUMMARY OF INVENTION

The present Applicants recognized that there was a need to be able to irradiate femtosecond laser pulses through a polymeric layer to change the refractive index of an underlying piece of glass without damaging the polymeric layer. The Applicants were able to accomplish this objective by focusing the femtosecond laser with a high numeric aperture lens.

One aspect of the present invention features a method of making an optical device comprising: selecting a glass substrate having a protective polymeric coating, and focusing a femtosecond laser beam with a high numerical aperture lens through the polymeric coating and to a point in the substrate to induce a refractive index change in the substrate without damaging the polymeric coating. The high numeric aperture lens used to focus the laser beam may have a numeric aperture of 0.6 to 1.4.

The substrate may be, for example, bulk glass or a glass fiber. Pursuant to the method, a Bragg grating may be written in a glass fiber. The method can result in the refractive index of the substrate being increase up to $10^{-2}$.

The femtosecond laser may further comprise an oscillator. The pulse width of the laser may be about 20 to about 600 femtoseconds and the pulse rate may be about 10 hertz to about 200 megahertz. The method may be carried out by translating the substrate relative to the laser beam, while it is exposed to the laser, at a speed of about 10 μm/sec to about 10 cm/sec.

Another aspect of the present invention is an optical device comprising: a glass substrate having a protective polymeric coating wherein at least one area in or on the substrate has a changed refractive index, which change was made while the protective polymeric layer was on the substrate. The glass of the optical device may be selected from the group comprising an oxide glass, a halide glass, a sulfide glass, and a chalcogenide glass. If the glass is an oxide glass it may be selected from the group comprising silicate, borate, sulphate, phosphate, fluorophosphates, or bismuthate. The glass of the optical device may comprise one or more of borosilicate, sulfide, lead, germanium, phosphorous, or cerium. The glass may be doped with one or more materials selected from the group consisting of $GeO_2$, $B_2O_3$, $Al_2O_3$, and $P_2O_5$.

In some embodiments, the glass substrate of the optical device is an optical fiber. In these embodiments, the areas of changed refractive index may form a Bragg grating.

As used in this invention:

"femtosecond laser" means a laser that emits pulsed radiation with a pulse duration shorter than 600 femtoseconds at a wavelength having a lower range of about 400 and an upper range of about 1000 nm, and "high numeric aperture" means a numeric aperture of about 0.6 to about 1.4.

An advantage of at least one embodiment of the present invention is that it eliminates the time-consuming steps of stripping the protective polymer off of a glass substrate that will be subjected to a femtosecond laser to change the refractive index, then reapplying the polymeric coating.

Another advantage of at least one embodiment of the present invention is that the high numeric aperture lens used to focus the femtosecond laser in the glass substrate provides sufficient intensity at the laser focus to produce the region of increased refractive index while allowing the peak laser power to be maintained at a level less than that required for self focusing. This provides an added degree of control of the shape of the region of increased refractive index.

Other features and advantages of the invention will be apparent from the following drawings, detailed description, and claims.

BRIEF DESCRIPTION OF DRAWINGS

FIG. 7 is an illustration of the far field mode profile at a wavelength of 1550 nm obtained for the line in the glass slide of Example 5.

FIGS. 8a–8c are digital images of optical micrographs of cross-sectional views of lines written in polymer-coated glass slides using different numeric apertures.

DETAILED DESCRIPTION

Figure 1:
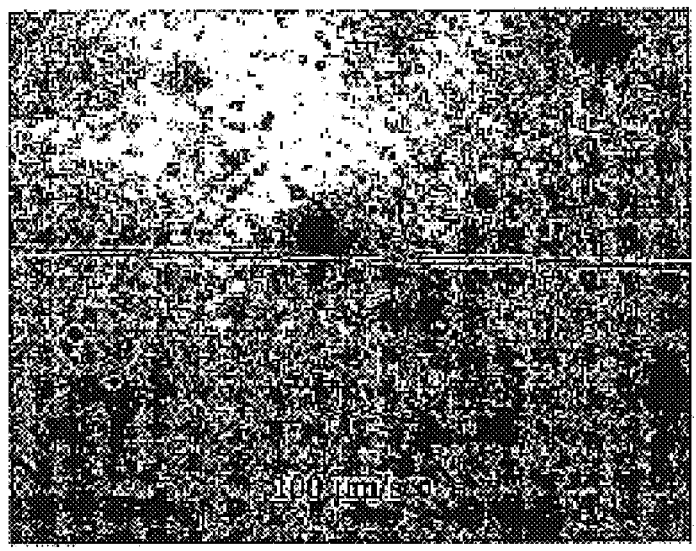
FIG. 1 is a digital image of an optical micrograph of the glass slide of Example 1, in which a line of 2–3 μm in width was written using the technique of the present invention.
Figure 2:
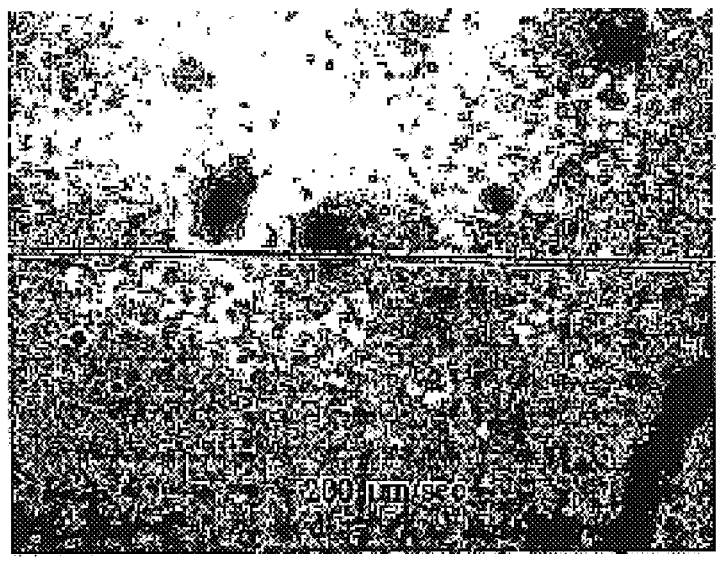
FIG. 2 is a digital image of an optical micrograph of the polymer-coated glass slide of Example 2, in which a line of 2–3 μm in width was written using the technique of the present invention.
Figure 3:
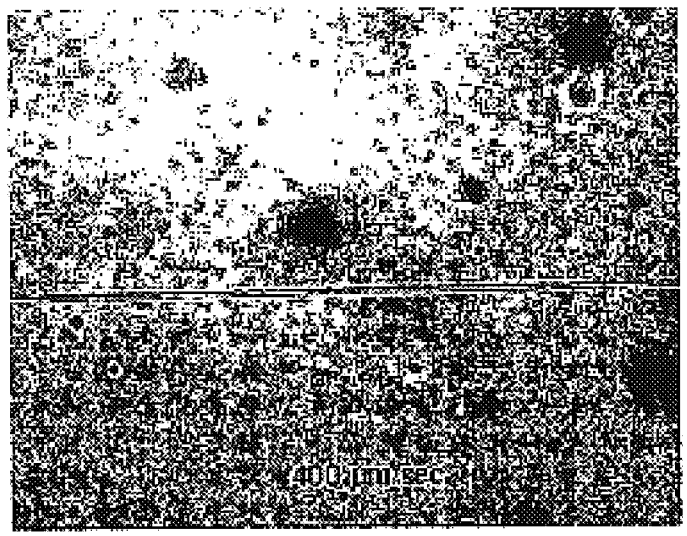
FIG. 3 is a digital image of an optical micrograph of the polymer-coated glass slide of Example 3, in which a line of 2–3 μm in width was written using the technique of the present invention.
Figure 4:
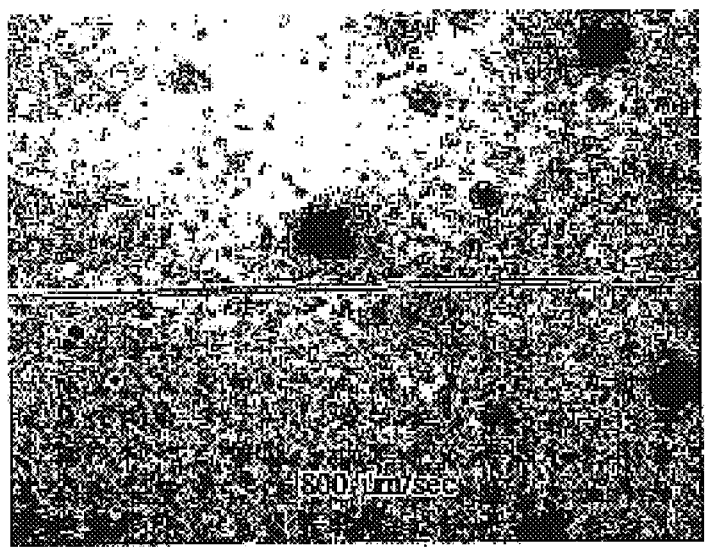
FIG. 4 is a digital image of an optical micrograph of the polymer-coated glass slide of Example 4, in which a line of 2–3 μm in width was written using the technique of the present invention.

The process of the current invention uses a femtosecond laser to modify the refractive index of a polymer-coated glass sample. This is done by focusing the femtosecond beam to a focal point in the interior of the glass using a high numeric aperture lens. To be effective, the glass and its polymeric coating need to be sufficiently transparent at the laser wavelength so absorption levels in the coating or in regions of the glass immediately adjacent to the coating are not enough to adversely affect the coating. In the region around the focal point of the high numeric aperture lens, the laser intensity is sufficiently large (greater than about $10^{14}$ $W/m^2$) to cause changes in the glass that increase the refractive index of the glass in a volume around the focal point by amounts as large as $10^{-2}$. The laser intensity is due, for the most part, to the high numeric aperture (between about 0.6 and about 1.4) of the focusing optic and the short laser pulse duration (less than about 600 femtoseconds, preferably between about 20 and about 600 femtoseconds). However, at the coating, the laser beam intensity is sufficiently low that the coating is not damaged.

The process of the invention allows the modification of the glass refractive index with a femtosecond laser without removing the protective coating on the glass. This index modification could be performed in such a manner as to produce a pattern by moving the substrate and the laser beam relative to each other using, for example, translation stages or galvoscanners, or by using diffractive optical elements such as diffraction gratings. When the beam and the substrate are moved relative to each other, translation speeds preferably range from about 10 $\mu$m/sec to about 10 cm/sec depending on the pulse rate, power density, and numeric aperture of the focusing lens.

The wavelength of the laser may be from about 200 to about 2100, preferably from about 400 to about 1000 nm. The wavelength of the pulsed laser beam should differ from the intrinsic absorption wavelength of the glass and polymer coating.

The laser beam preferably has a peak power density of between about $10^{15}$ $W/m^2$ and about $10^{18}$ $W/m^2$ at the focal point, but the necessary peak power will depend on the type of glass being used. However, at a high peak power density, the refractive index will be changed at the focal point regardless of the composition of the glass. But care must be taken not to use excessive peak power density to avoid the formation of voids and microcracks at the laser focus. Peak power density may be strengthened by making pulse durations shorter.

Laser pulse energy is preferably in the range of about 1 nanoJoule to about 10 microJoules.

A laser having a pulse rate of about 10 hertz to about 200 megahertz is useful for the present invention. Pulse rate will affect scanning time. Faster pulse rates allow for faster scanning time while still obtaining smooth structure. Pulse rates are preferably about 1 kilohertz to about 100 megahertz.

Any femtosecond laser is suitable for the present invention. An example of a suitable laser is a femtosecond near-infrared titanium sapphire oscillator (for example, a Mai-Tai model available from Spectra-Physics, Santa Clara, Calif.) pumped by a diode-pumped solid-state laser (for example, a Spectra-Physics Millenia model). This laser, operating at 80 MHz, has a pulse width of less than 100 femtoseconds, is tunable between 760 and 920 nm, and has average power up to 0.9 Watts. Amplified femtosecond oscillator beams may also be used for the present invention. An example of a suitable amplified femtosecond beam is provided by the Spectra-Physics Hurricane, which operates at a wavelength of 800 nm and a pulse rate of 1 kHz with a pulse duration of approximately 100 femtoseconds at an average power of up to 1 W.

An optical device such as a waveguide or Bragg grating in an optical fiber core can be made by continuously scanning the polymer-coated glass with the laser beam to alter the refractive index over a two- or three-dimensional portion of the substrate.

This method is especially advantageous in working with optical fibers because they are brittle and break easily when they are handled or wound on a spool without having a polymer coating.

An optical device according to the present invention includes a glass in which the refractive index of a region has been changed by laser beam irradiation applied through a polymeric coating on the glass. The optical device is formed by focusing a high energy pulsed laser beam having sufficient energy to induce structural change in the glass at a focal point of the laser beam. Any type of glass may be suitable. The glass may be a bulk piece of glass, a fiber, or any other glass article. In one embodiment, the glass may be an oxide glass, a halide glass, a sulfide glass, or a chalcogenide glass. An oxide glass may comprise, e.g., one or more of silicate, borate, sulphate, phosphate, fluorophosphates, or bismuthate. The glass may comprise, e.g., one or more of borosilicate, sulfide, lead, germanium, phosphorous, or cerium. The glass may be doped with, e.g., one or more of $GeO_2$, $B_2O_3$, $Al_2O_3$, $TiO_2$, or $P_2O_5$. Typical polymeric protective coatings include epoxies, acrylates, or silicones. Any suitable polymer may be used as long as it does not absorb enough energy at the laser beam wavelength to cause its mechanical properties to weaken. Weakened mechanical properties of the polymer may be indicated by darkening, charring, or pitting of the polymer.

EXAMPLES

This invention may be illustrated by way of the following examples.

Examples

Examples 1–4

These examples illustrate imaging of lines with increased refractive index in a glass substrate through a polymer coating using a focusing lens with a numeric aperture near the low end of the desired range.

A soda lime float glass slide with a thickness of 1.8 mm was coated with an acrylate (available as DSM-136 from DSM Desotech, Elgin, Ill.) having an uncured layer thickness of about 50 microns (2 mils). The acrylate coating was cured by translating the coated glass slide past a Fusion D bulb at a translation speed of about 15.2 m/min (50 ft/min) in a nitrogen atmosphere (residual oxygen concentration of 70 ppm). The coated glass substrate was exposed to pulses from a regeneratively amplified titanium:sapphire laser (Spectra-Physics Hurricane model) operating at a wavelength of 800 nm with a pulse duration of approximately 100 femtoseconds (fs) and a pulse rate of 1 kHz. The laser beam was focused at approximately 750 μm beneath the glass surface by a 3.1 mm focal length aspheric lens (numerical aperture=0.68). The laser output power was about 900 mW and was attenuated by a neutral density filter to a level of 8.7 mW (pulse energy 8.7 μJ). The laser exposure was done by translating the glass substrate in a direction perpendicular to the direction of beam propagation through the attenuated beam at a scan speed of 100 μm/sec to form lines in the glass having a different refractive index. With the aspheric lens used to focus the beam, these translation speeds corresponded to an exposure of any part of the irradiated line to approximately 20 laser pulses at the 1 kHz pulse rate. After the laser exposure the glass sample was polished on the sides perpendicular to the laser written lines using a sequence of 5 minute exposures to 15, 6, 1, and 0.5 μm diamond lapping film at a polishing force of 4 pounds.

The height of the laser written lines along the beam propagation direction could then be measured from the cross-sectional views provided by the polished sides. Values of the change in refractive index of the laser written lines from the value of the bulk glass slide (Δn) were estimated from the optical path difference produced by these lines when the sample was viewed from the top using an aus Jena Interphako (interference) microscope (λ=546 nm), manufactured by Carl Zeiss Jena in Jena Germany. The waveguiding properties of some of the lines were examined by launching light from a fiber-coupled laser (λ=633 or 1550 nm) into the line at one polished end and measuring the intensity of the laser light emitted from the line at the opposite polished face.

Examples 2–4 were made as Example 1 except that they were translated through the attenuated laser beam at scan speeds of 200, 400, and 800 μm/sec, respectively. These scan speeds corresponded to exposures of any part of the irradiated line to approximately 10, 5, and 2.5 laser pulses at the 1 kHz pulse rate.

Figure 5:
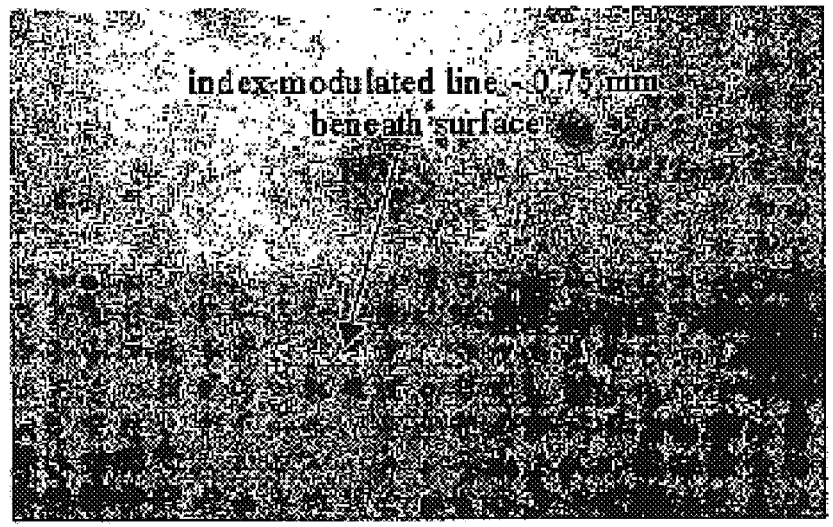
FIG. 5 is a digital image of an optical micrograph of a polymer-coated glass slide, in which a line of 2–3 μm in width was written, using the technique of the present invention, with the microscope focused on the surface of the polymer coating.
Figure 6:
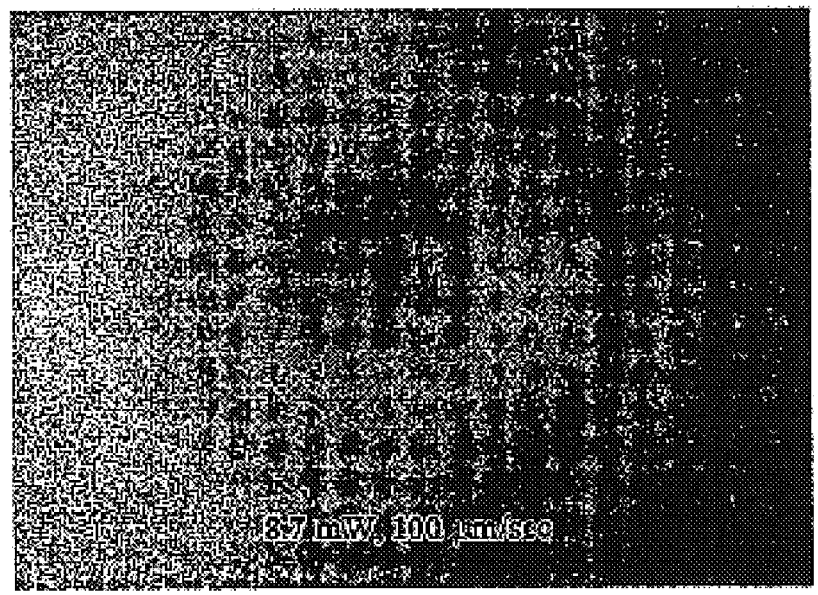
FIG. 6 is a digital image of an optical micrograph of a cross-sectional view of the polymer-coated glass slide of Example 1.

Lines were able to be written in all the glass slides used for Examples 1–4 without any noticeable degradation of the acrylate coating. FIGS. 1-4 are optical micrographs of the top view of Examples 1–4. The lines in the glass are clearly visible with no hint of degradation of the overlying acrylate coating. FIG. 5 is an optical micrograph of a top view of the region of Example 2 where a line was written but this time with the microscope focused on the surface of the acrylate coating. This micrograph shows that there is no detectable damage as would be seen by pitting, darkening, or charring of the coating. Lack of detectable damage to the acrylate is believed to be due to the high numeric aperture lens (NA= 0.68) which produced low laser intensity in the coating but focused the laser beam sharply enough in the glass to an intensity sufficient to write the index modulated line. The laser written line is also visible in this micrograph, but the image of the line is faint and blurred since the line was located beyond the depth of field of the microscope objective. FIG. 6 is a micrograph of a cross-sectional view of the line produced in Example 1. The micrograph shows that the line has a high aspect ratio shape, with a width of approximately 3 μm and a height of approximately 100 μm. Close examination of the top view micrographs of FIG. 1-4 shows that the lines all have an irregular or rough boundary. The spatial period of the line roughness seems to correlate with translation speed: as the speed was increased the features moved farther apart. For this reason it is believed that this roughness was due to the translation stage used to move the glass slides relative to the beam. The roughness made the light guiding properties of the lines poor, producing considerable leakage and scattering of the laser light launched into the lines. It was possible, however, in a cross section view, to find regions of the high aspect ratio feature that guided light.

Example 5

This example illustrates the light guiding characteristics of a line written in a glass substrate using laser conditions similar to those used in Examples 1–4, but with a translation stage that produced lines with smooth boundaries.

Example 5 was made using a piece of 1.1 mm thick Corning 1737 glass using the 0.68 NA aspheric lens of Examples 1–4 with a laser pulse energy of 6.9 μJ from the regeneratively amplified laser. In this example the sample translation rate was 200 μm/sec using a high-resolution x,y-stage (resolution of 4 nm in the x,y-plane). FIG. 7 is an illustration of the far field mode profile at a wavelength of 1550 nm obtained for the line of Example 5. Δn values of approximately $10^{-3}$ were obtained from the optical path differences measured from this line with an interference microscope. The line had a width of approximately 3 μm and a height of approximately 45 μm for an aspect ratio of approximately 15.

Example 6

This example illustrates the decrease in aspect ratio of lines written in glass as the numeric aperture of the focusing objective is increased toward the high end of the desired range.

Example 6 was made in a piece of the same Corning 1737 glass as was used for Example 5. Lines were drawn at a speed of 200 μm/sec using the high-resolution x,y-stage with a laser pulse energy of approximately 10 μJ from the regeneratively amplified laser. Three different lenses were used to focus the laser beam in the interior of the glass sample. One set of lines was drawn with the 3.1 mm focal length, 0.68 NA aspheric lens used for Examples 1–5. Two other sets of lines were drawn using either a 60×, 0.85 NA microscope objective or a 100× immersion objective (available from Edmund Scientific, Barrington, N.J.) immersed in Cargille 1160 index matching fluid (n=1.515 at 25° C.) (available from Cargille Laboratories, Cedar Grove, N.J.). Under the conditions used, the immersion objective has a numeric aperture of 1.25. FIGS. 8a–8c show cross-sectional views of lines written using the different numeric apertures. With 10 μJ pulses at a numeric aperture of 0.68, lines with an aspect ratio of 34 were obtained (3 μm wide×102 μm high)(FIG. 8a). With a numeric aperture of 0.85, lines with an aspect ratio of 6 were obtained (9 μm wide×56 μm high)(FIG. 8b). With a numeric aperture of 1.25, lines with an aspect ratio of 3 were obtained (10 μm wide×33 μm high)(FIG. 8c). The decrease in aspect ratio with increasing numeric aperture is due to a decrease in length along the propagation direction of the volume around the laser focal point where the intensity is above the threshold required for index modulation. This control of the shape of the high intensity volume around the laser focal point allows index modulation of glass without damage to a protective polymer coating on the glass surface.

Example 7

This example illustrates highly symmetric, low aspect ratio features made in glass using a high numeric aperture objective and lower laser pulse energies.

Figure 9:
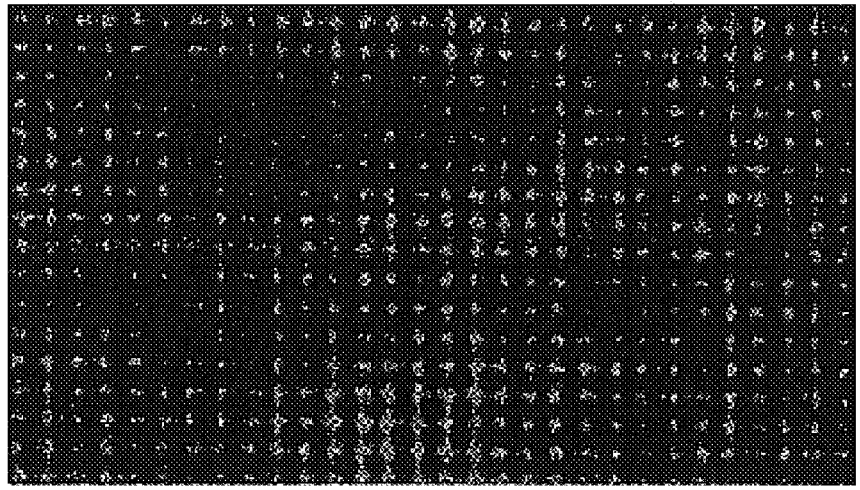
FIG. 9 is a digital image of an optical micrograph of a line written in a polymer-coated glass slide using a 1.25 numeric aperture.
Figure 10:
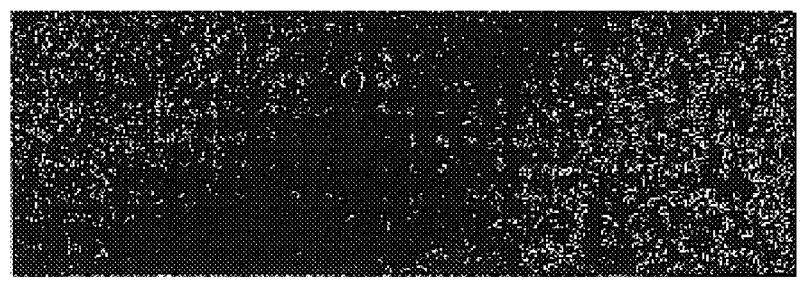
FIG. 10 is a digital image of an optical micrograph cross-sectional view of the same line shown in FIG. 9.

Example 7 was made from the same piece of soda lime float glass coated with an acrylate layer as was used for Examples 1–4. The glass substrate was exposed to pulses from a titanium:sapphire femtosecond oscillator (Spectra-Physics Mai Tai) operating at a wavelength of 800 nm with a pulse duration less than 100 femtoseconds at a pulse repetition rate of 80 MHz. The laser power level used was 750 mW corresponding to a pulse energy of 9.4 nanoJoule. The laser beam was focused at a distance of approximately 250 μm below the interface between the acrylate and the glass. Focusing was accomplished with the 100× immersion objective used in Example 6. Lines were written in the glass slide by translating the glass at a speed of 5 mm/sec relative to the laser beam in a direction perpendicular to the beam propagation direction using the high-resolution x,y-stages. As in Examples 1–4, the laser intensity in the acrylate coating was below the damage threshold of the polymer, but due to the high numeric aperture of the focusing objective the intensity was sufficient to produce refractive index modulation in the glass. FIG. 9 shows a micrograph of the top view of one of the lines drawn at this laser condition. A cross-sectional view of this line is shown in FIG. 10. The line is approximately 25 μm wide and 37 μm high for an aspect ratio of 1.5. This lower aspect ratio is due to the more confined region of high intensity provided by the higher numeric aperture objective lens in combination with the lower laser pulse energy used. The lower pulse energy results in lower peak power in the laser beam, which decreases the amount of self-focusing in the glass, leading to the symmetric shape of the region of index modulation.

Various modifications and alterations of this invention will become apparent to those skilled in the art without departing from the scope and spirit of this invention and it should be understood that this invention is not to be unduly limited to the illustrative embodiments set forth herein.

What is claimed is:

1. A method of making an optical device comprising: selecting a glass substrate having a protective polymeric coating, and focusing a femtosecond laser beam with a high numerical aperture lens through the polymeric coating and to a point in the substrate to induce a refractive index change in the substrate without damaging the polymeric coating.

2. The method of claim 1 wherein the substrate is a glass fiber.

3. The method of claim 2 wherein a Bragg grating is written in the glass fiber.

4. The method of claim 1 wherein the high numeric aperture lens used to focus the laser beam has a numeric aperture of 0.6 to 1.4.

5. The method of claim 1 wherein the substrate is bulk glass.

6. The method of claim 1 wherein the refractive index of the substrate is increased up to $10^{-2}$.

7. The method of claim 1 wherein the femtosecond laser further comprises an oscillator.

8. The method of claim 1 wherein the pulse width of the laser is about 20 to about 600 femtoseconds.

9. The method of claim 1 wherein the pulse rate of the laser is about 10 hertz to about 200 megahertz.

10. The method of claim 1 wherein the laser pulse energy is in the range of about 1 nanoJoule to about 10 microJoules.

11. The method of claim 1 wherein the substrate is translated relative to the laser beam, while being exposed to the laser, at a speed of about 10 μm/sec to about 10 cm/sec.

12. An optical device comprising:

A glass substrate having a protective polymeric coating wherein at least one area in or on the substrate has a changed refractive index, which change was made while the protective polymeric layer was on the substrate.

13. The optical device of claim 12 wherein the glass is selected from the group comprising an oxide glass, a halide glass, a sulfide glass, and a chalcogenide glass.

14. The optical device of claim 13 wherein the oxide glass is selected from the group comprising silicate, borate, sulphate, phosphate, fluorophosphates, or bismuthate.

15. The optical device of claim 12 wherein the glass substrate is an optical fiber.

16. The optical device of claim 15 wherein the areas of changed refractive index form a Bragg grating.

17. The optical device of claim 12 wherein the glass comprises one or more of borosilicate, sulfide, lead, germanium, phosphorous, or cerium.

18. The optical device of claim 12 wherein the glass substrate is doped with one or more materials selected from the group consisting of $GeO_2$, $B_2O_3$, $Al_2O_3$, $TiO_2$, and $P_2O_5$.

* * * * *